(12) United States Patent
Kim et al.

(10) Patent No.: US 7,605,596 B2
(45) Date of Patent: Oct. 20, 2009

(54) PROBE CARD, APPARATUS AND METHOD FOR INSPECTING AN OBJECT

(75) Inventors: Yang-Gi Kim, Yongin-si (KR);
Sang-Kyu Yoo, Yongin-si (KR);
Byung-Soo Moon, Seongnam-si (KR);
Mi-Yeon Cho, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 11/510,620

(22) Filed: Aug. 28, 2006

(65) Prior Publication Data
US 2007/0046303 A1 Mar. 1, 2007

(30) Foreign Application Priority Data
Aug. 30, 2005 (KR) ................ 10-2005-0079771

(51) Int. Cl.
*G01R 31/02* (2006.01)
*G01R 31/26* (2006.01)
(52) U.S. Cl. .................... 324/754; 324/765
(58) Field of Classification Search ........... 324/754, 324/765, 158.1
See application file for complete search history.

(56) References Cited

U.S. PATENT DOCUMENTS

| 7,138,792 B2* | 11/2006 | Fu et al. ............ 324/158.1 |
| 2003/0234659 A1* | 12/2003 | Zieleman ............ 324/765 |
| 2004/0041579 A1* | 3/2004 | Kim et al. ............ 324/765 |
| 2005/0007140 A1* | 1/2005 | Kim et al. ............ 324/765 |

FOREIGN PATENT DOCUMENTS

| JP | 07-169806 | 7/1995 |
| JP | 2005-005343 | 1/2005 |
| KR | 1020010112792 A | 12/2001 |

* cited by examiner

*Primary Examiner*—Ha Tran T Nguyen
*Assistant Examiner*—Joshua Benitez
(74) *Attorney, Agent, or Firm*—Harness Dickey & Pierce, P.L.C.

(57) ABSTRACT

A probe card, an apparatus and a method of inspecting an object. In the example method, a first inspection current may be divided into a plurality of first divided inspection currents. Each of the first divided inspection currents may be supplied to a different one of a plurality of first chips. A second inspection current may be selectively applied to a second chip other than the first plurality of chips. In an example, the second inspection current may be substantially equal to at least one of the plurality of first divided inspection currents. In a further example, the example probe card and/or the apparatus may perform the example method.

9 Claims, 7 Drawing Sheets

PROBE CARD, APPARATUS AND METHOD FOR INSPECTING AN OBJECT

PRIORITY STATEMENT

This application claims priority under 35 USC § 119 to Korean Patent Application No. 2005-79771, filed on Aug. 30, 2005, the contents of which are herein incorporated by reference in their entirety.

BACKGROUND OF THE INVENTION

1. Field of the Invention

Example embodiments of the present invention relate generally to a probe card, an apparatus and a method for inspecting an object, and more particularly to a probe card, an apparatus and a method for inspecting an object including normal or abnormal chips.

2. Description of the Related Art

A conventional semiconductor device manufacturing process may include forming a pattern on a semiconductor substrate and dividing the semiconductor substrate into a plurality of chips based on the pattern. An electrical die sorting (EDS) process for inspecting electrical characteristics of each of the plurality of chips may be carried out between the formation of the pattern and the dividing of the substrate into the plurality of chips.

Abnormal chips among the plurality of chips may be detected by the EDS process. In an example, a probe card may be used in the EDS process. The probe card may supply an inspection current to each of the plurality of chips. The probe card may determine whether or not each of the plurality of chips is normal based on an electrical signal outputted from the chips in response to the supplied inspection current. A conventional probe card may include a printed circuit board (PCB) upon which electrical circuits may be formed, and also a plurality of needles for making contact with the electrical circuits to provide the chips with the inspection current.

A conventional exposure process for forming a pattern may be performed on a single region of a semiconductor substrate upon which only one chip may be formed. Alternatively, the exposure process may be executed simultaneously at two regions of a semiconductor substrate in order to improve an efficiency of a semiconductor manufacturing process as compared to the single-chip exposure process.

An "abnormal" chip may be formed on an edge portion of the semiconductor substrate, or, alternatively, on a central portion of the semiconductor substrate surrounded by the edge portion. In an example, the abnormal chip may include an abnormal circuit, such as a short circuit or an opened circuit.

FIG. 1 is a cross-sectional view illustrating a conventional probe apparatus 10 for inspecting electrical characteristics of a semiconductor substrate. Referring to FIG. 1, the conventional probe apparatus 10 may include an inspection unit 20, a probe card 30 and a current cutting unit 40. The probe card 30 may include a PCB 31 upon which circuits 32 may be formed, and a plurality of needles 35 may be electrically connected to the circuits 32 one by one. The inspection unit 20 may supply inspection currents to each of the circuits 32. The needles 35 may make contact with a plurality of chips to provide the chips with the inspection currents.

Referring to FIG. 1, when the inspection current is supplied to an abnormal chip C2 through the needle 35, an excessive current may be applied to the needle 35 from the abnormal chip C2. Because a relatively high amount of heat may be generated at a tip of the needle 35 to which the excessive current may be applied, the tip of the needle 35 may be burnt out such that the needle 35 may not be usable. In order to reduce the occurrence of the needle 35 being "burnt out", the current cutting unit 40 may cut off the supply of the inspection current to the needle 35.

While the conventional probe apparatus 10 shown in FIG. 1 may reduce the occurrence of tips of the needle 35 being "burnt out", the probe apparatus 10 may be associated with a relatively complex circuit arrangement of the circuits 32 in the PCB 31 and also may reduce the efficiency of the inspection because the inspection currents may be separately supplied to each of the needles 35.

FIG. 2 is a cross-sectional view illustrating another conventional probe apparatus 50 for inspecting electrical characteristics of a semiconductor substrate Referring to FIG. 2, the conventional probe apparatus 50 may include an inspection unit 60, a probe card 70 and a current cutting unit 80. The probe card 70 may include a PCB 71 upon which circuits 72 may be formed, and may further include a plurality of needles 75 electrically connected to the circuits 72. The needles 75 and the circuits 72 may have a plural-to-one correspondence (e.g. twice the number of needles 75 to circuits 72). For example, one (1) circuit 72 may be electrically connected to two (2) needles 75. Thus, a single inspection current from the circuit 72 may be halved. The halved inspection currents may then be supplied to each of the two needles 75, respectively.

Therefore, the number of the circuits 72 in the probe apparatus 50 of FIG. 2 may be half that of the circuits 32 in the probe apparatus 10 of FIG. 1. Further, the probe apparatus 50 of FIG. 2 may have an improved inspection efficiency compared to that of the probe apparatus 10 of FIG. 1.

However, when the two needles 75 receiving the inspection currents from the circuit 72 simultaneously make contact with a normal chip C1 and an abnormal chip C2, respectively, the current cutting unit 80 may not block the supply of the inspection current supply into the two needles 75. When the current cutting unit 80 blocks (i.e., cuts off) the inspection current supply, the inspection currents may not flow into the needle 75 making contact with the normal chip C1 and/or the needle 75 connected to the abnormal chip C2 such that an inspection of the normal chip C1 may not be performed. To perform the inspection with respect to the normal chip C1, the supply of the halved inspection current into the abnormal chip C2 may be neglected. As a result, the inspection currents may flow into the tip of the needle 75 making contact with the abnormal chip C2, hence the tip of the needle 75 may still become burnt out.

SUMMARY OF THE INVENTION

An example embodiment of the present invention is directed to a method of inspecting an object, including dividing a first inspection current into a plurality of first divided inspection currents, supplying each of the first divided inspection currents to a different one of a plurality of first chips and selectively supplying a second inspection current, is the second inspection current substantially equal to at least one of the plurality of first divided inspection currents, to a second chip other than the plurality of first chips.

Another example embodiment of the present invention is directed to a probe card, including a printed circuit board (PCB) including a first circuit and a second circuit, a plurality of first needles electrically connected to the first circuit, the plurality of first needles and the first circuit having a plural-to-one ratio and at least one second needle electrically connected to the second circuit, the at least one second needle and the second circuit having a one-to-one ratio.

Another example embodiment of the present invention is directed to an apparatus for inspecting an object, including a stage supporting the object, a probe card including a PCB, the PCB including a first circuit and a second circuit, a plurality of first needles electrically connected to the first circuit, the plurality of first needles and the first circuit having a plural-to-one ratio and at least one second needle electrically connected to the second circuit, the at least one second needle and the second circuit having a one-to-one ratio and an inspection unit selectively supplying a first inspection current to the plurality of first needles and a second inspection current to the at least one second needle through the first and second circuits, respectively.

BRIEF DESCRIPTION OF THE DRAWINGS

The accompanying drawings are included to provide a further understanding of the invention, and are incorporated in and constitute a part of this specification. The drawings illustrate example embodiments of the present invention and, together with the description, serve to explain principles of the present invention.

DETAILED DESCRIPTION OF EXAMPLE EMBODIMENTS OF THE PRESENT INVENTION

Figure 1:
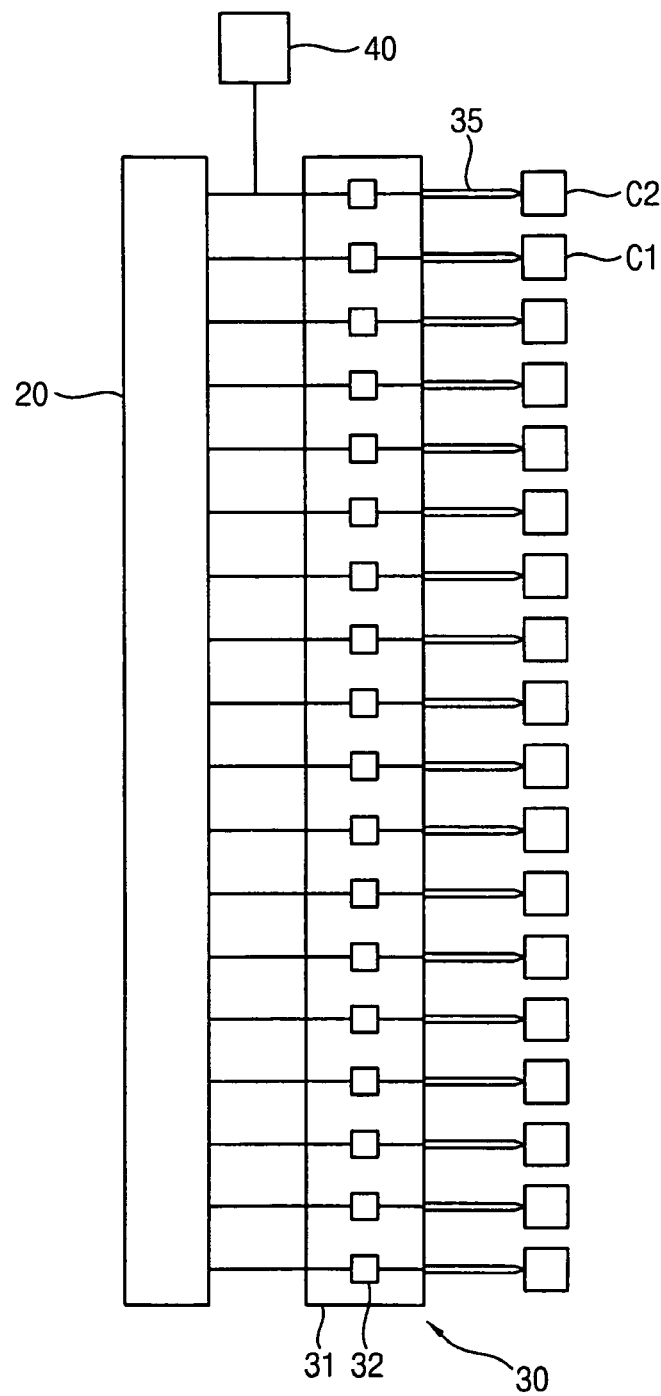
FIG. 1 is a cross-sectional view illustrating a conventional probe apparatus for inspecting electrical characteristics of a semiconductor substrate.
Figure 2:
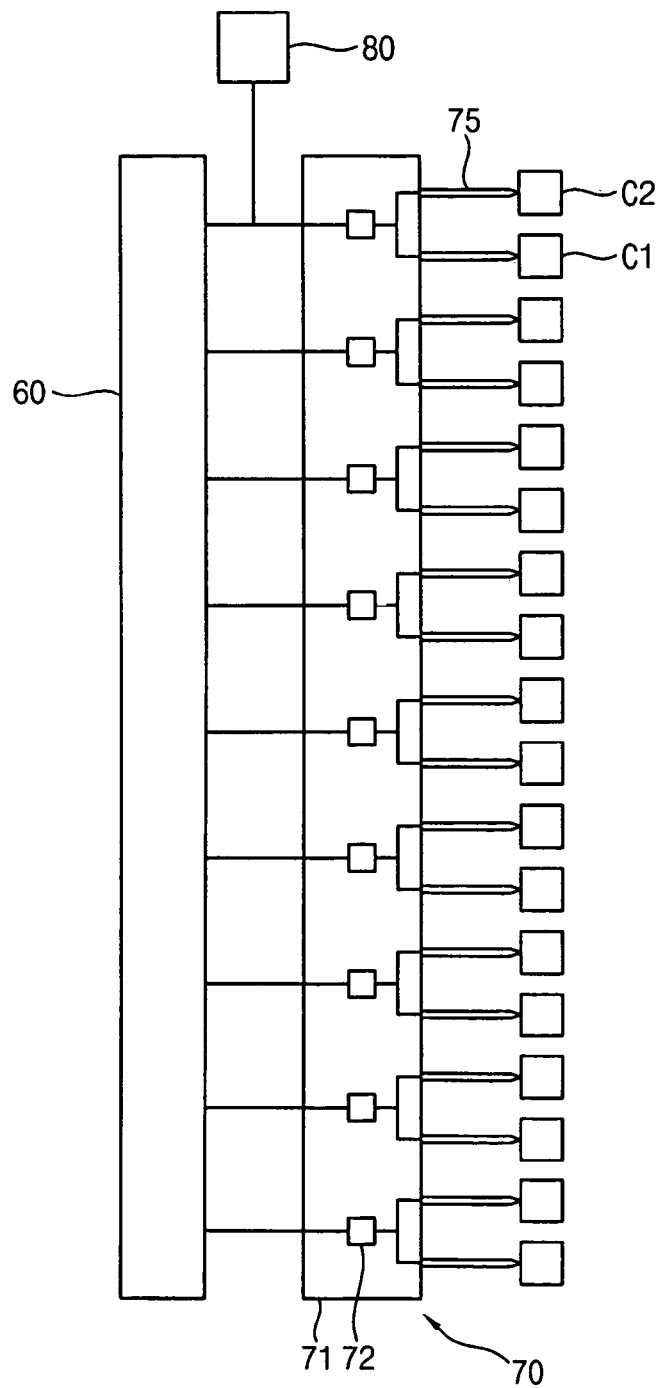
FIG. 2 is a cross-sectional view illustrating another conventional probe apparatus for inspecting electrical characteristics of a semiconductor substrate

Example embodiments of the present invention are described more fully hereinafter with reference to the accompanying drawings, in which example embodiments of the invention are shown. Example embodiments of the present invention may, however, be embodied in many different forms and should not be construed as limited to the example embodiments set forth herein. Rather, the example embodiments are provided so that this disclosure will be thorough and complete, and will fully convey the scope of the invention to those skilled in the art. In the drawings, the size and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, when the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the invention. As used herein, the singular forms "a," "an" and "the" are intended to include the plural forms as well, unless the context clearly indicates otherwise. It will be further understood that the terms "includes" and/or "including," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 3:
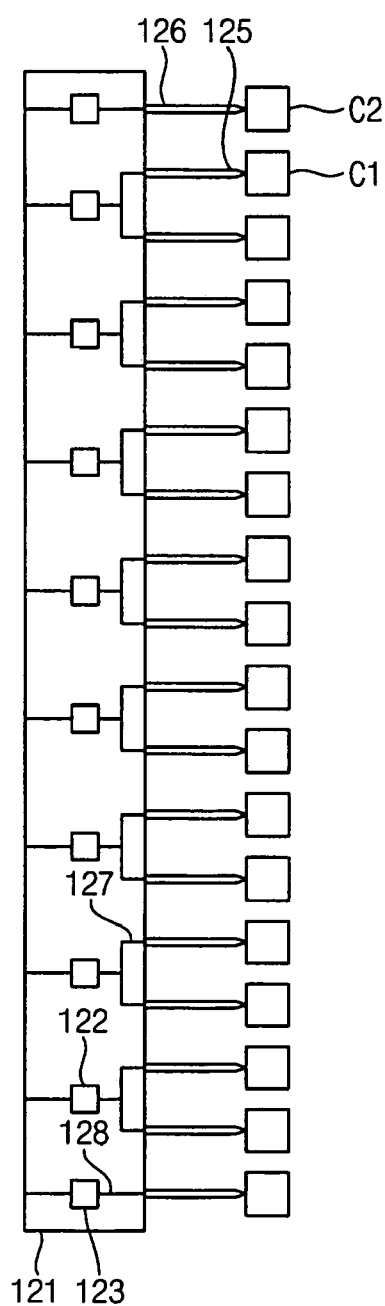
FIG. 3 is a cross-sectional view illustrating a probe card in accordance with an example embodiment of the present invention.

FIG. 3 is a cross-sectional view illustrating a probe card 100 in accordance with an example embodiment of the present invention.

In the example embodiment of FIG. 3, the probe card 100 may include a PCB 121 having a plurality of first circuits 122 and a plurality of second circuits 123, and a plurality of first and second needles 125 and 126 electrically connected to the first and second circuits 122 and 123, respectively.

In the example embodiment of FIG. 3, the first circuits 122 may be arranged on a first portion (e.g., a central portion) of the PCB 121. Each of the first circuits 122 may include a plurality of parallel lines 127. Thus, two first needles 125 may be electrically connected to the two parallel lines 127 for each of the first circuits 122, respectively. Accordingly, a plurality of the first needles 125 may be electrically connected to a single first circuit 122.

In the example embodiment of FIG. 3, the first needles 125 may contact a plurality of first chips C1 that are formed on an object (e.g., a central portion of the object), such as a semiconductor substrate. A first inspection current may flow to the first needles 125 through the first circuits 122 to inspect electrical characteristics of the first chips C1. When the first inspection current flows to the two parallel lines 127 from a single first circuit 122, the first inspection current may be substantially equally divided into two first divided inspection currents. Each of the first divided inspection currents may be supplied to each of the two first needles 125, respectively. As a result, two first chips C1 (e.g., connected to the two first needles 125) may be concurrently (e.g., simultaneously) inspected using a single first inspection current.

In the example embodiment of FIG. 3, the second circuits 123 may be arranged on a second portion (e.g., an edge portion) of the PCB 121. Each of the second circuits 123 may have a single serial line 128. A single second needle 126 may be electrically connected to the serial line 128 of each of the second circuits 123. Accordingly, each of the second circuits 123 may be electrically connected to the one second needle 126.

In the example embodiment of FIG. 3, the second needles 126 may contact a plurality of second chips C2 that are formed on a portion (e.g., an edge portion) of the object (e.g., semiconductor substrate). A second inspection current may be supplied to the second needle 126 through the second circuit 123 to inspect electrical characteristics of the second chips C2. The electrical characteristics in a single second chip C2 may thereby be inspected using a single second inspection current. In an example, when the second chip C2 is abnormal, the supply of the second inspection current to the second needle 126 may be reduced (e.g., cut off) without blocking the supply of the first inspection current to the first needle 125.

In the example embodiment of FIG. 3, because the first divided inspection current supplied to the first chip C1 may be substantially the same as the second inspection current supplied to the second chip C2, an amount of the first inspection current may be larger (e.g., two times larger) than that of the second inspection current. In an alternative example, when the first circuit 122 has three parallel lines (e.g., as opposed to two), the first inspection current may be substantially equally divided into three first divided inspection currents. Each of the three first divided inspection currents may be supplied to three first needles 125, respectively. In this example, an amount of the first inspection current may be approximately three times larger than that of the second inspection current. That is, an amount of the first inspection current may scale with the number of the first needles 125 electrically connected to the first circuit 122.

In the example embodiment of FIG. 3, because a single second circuit 123 may be electrically connected to a single second needle 126, the supply of the second inspection current to the second needle 126 may be reduced (e.g., cut off) without pausing the supply of the first inspection current to the first needle 125. Therefore, the second needle 126 may contact the abnormal second chip C2 with a reduced chance of being burnt out.

Figure 4:
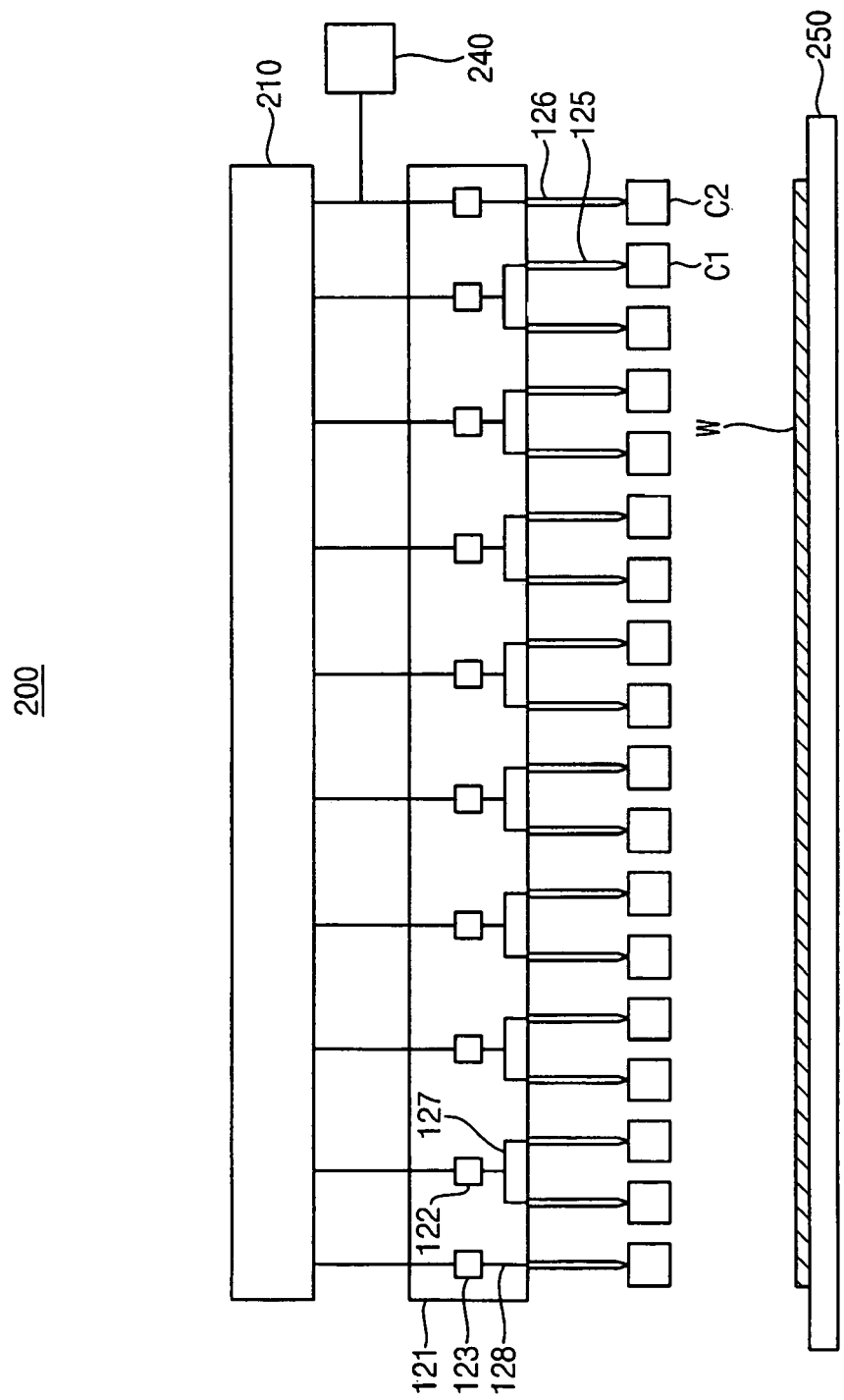
FIG. 4 is a cross-sectional view illustrating an apparatus for probing an object in accordance with another example embodiment of the present invention.

FIG. 4 is a cross-sectional view illustrating an apparatus 200 for probing an object in accordance with another example embodiment of the present invention. In an example, the apparatus 200 may be used to probe a device including the probe card 100 of FIG. 3.

In the example embodiment of FIG. 4, the apparatus 200 may include a stage 250 upon which a semiconductor substrate W may be placed, the probe card 100 of FIG. 3 arranged over the stage 250, an inspection unit 210 electrically connected to the probe card 100, and a current cutting unit 240. The probe card 100 illustrated in FIG. 4 has already been described above with respect to FIG. 3. Accordingly, a further description of the probe card 100, except as relates to its interface with other elements in FIG. 4 not previously described, has been omitted for the sake of brevity.

In the example embodiment of FIG. 4, the inspection unit 210 may supply the first and second circuits 122 and 123 of the probe card 100 with the first and second inspection currents, respectively. The first and second inspection currents may be supplied to the first and second chips C1 and C2 of the semiconductor substrate W through the first and second needles 125 and 126, respectively. The inspection unit 210 may inspect electrical characteristics of the first and second chips C1 and C2 based on the first and second inspection currents.

In the example embodiment of FIG. 4, the current cutting unit 240 may selectively reduce (e.g., cut off) the supply of the second inspection current to the second chip C2. For example, when the second chip C2 corresponds to an abnormal chip formed on an edge portion of the semiconductor substrate W, the electrical characteristics of the abnormal second chip C2 need not be inspected. Thus, the current cutting unit 240 may reduce (e.g., cut off) the supply of the second inspection current to the abnormal second chip C2 to reduce an occurrence of a tip of the second needle 126, which may contact the abnormal second chip C2, being burnt out. In an alternative example, when the second chip C2 corresponds to a normal chip formed on a central portion of the semiconductor substrate W, the current cutting unit 240 may not reduce (e.g., cut off) the supply of the second inspection current to the normal second chip C2. Thus, the electrical characteristics of the normal second chip C2 may be inspected using the second inspection current.

Figure 5:
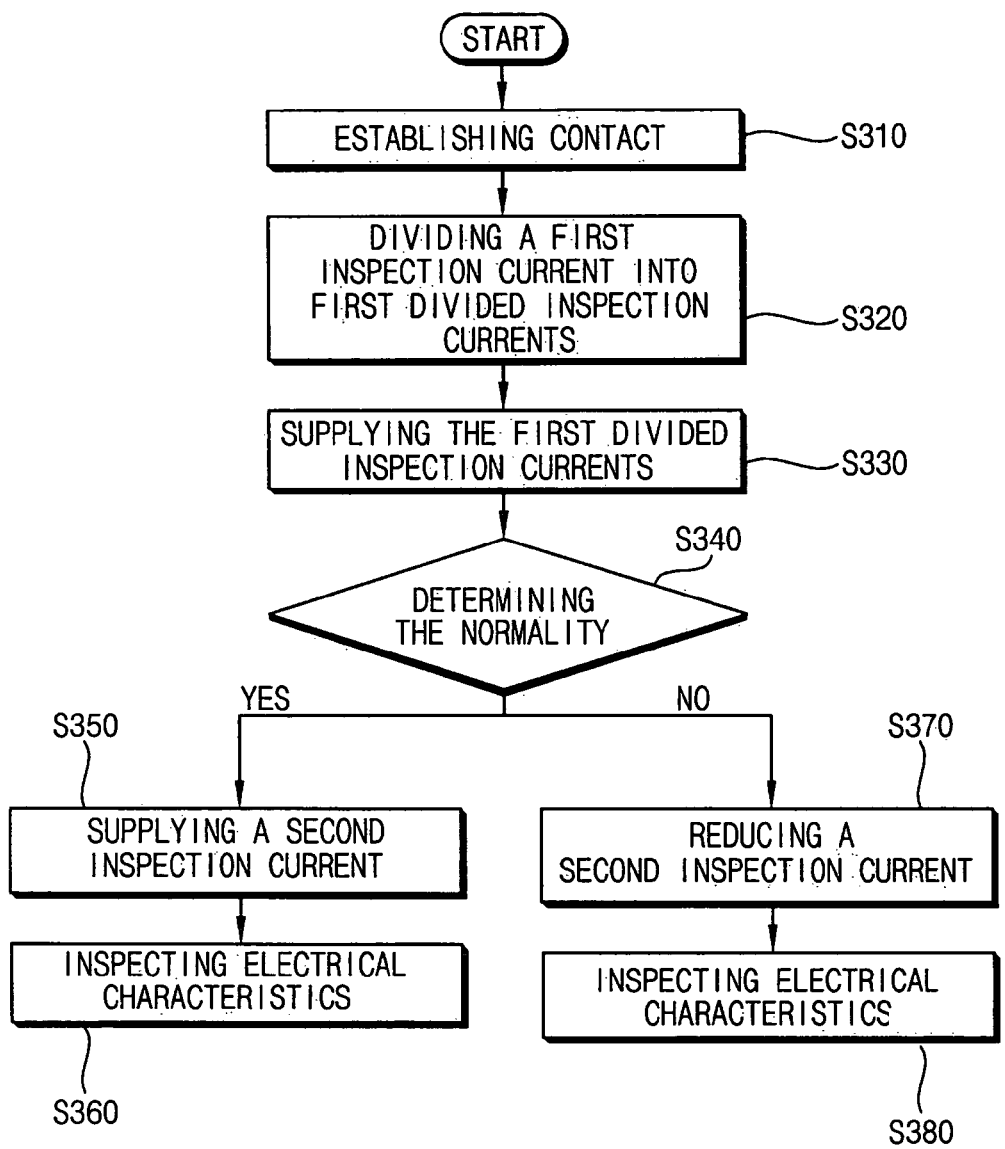
FIG. 5 is a flow chart illustrating a process of inspecting electrical characteristics of chips on a semiconductor substrate according to another example embodiment of the present invention.
Figure 6:
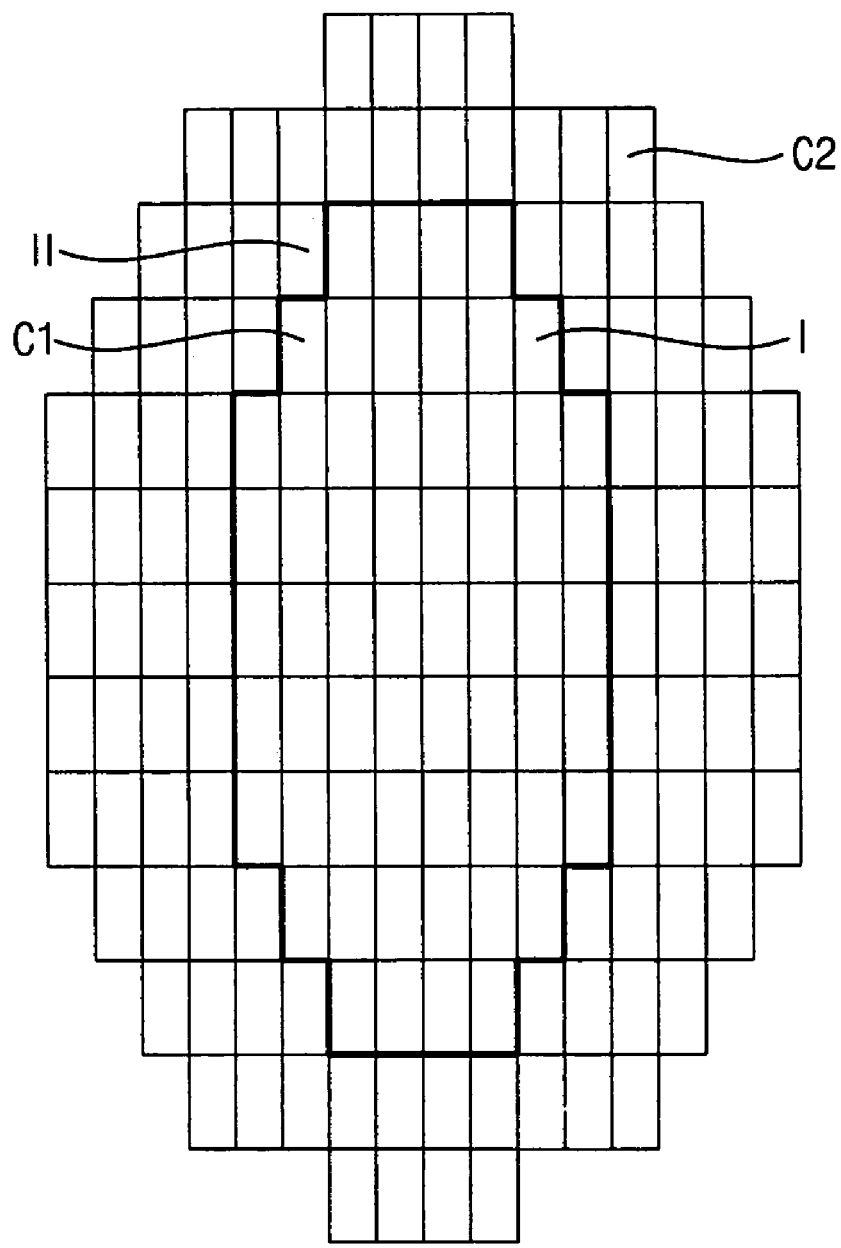
FIG. 6 is a plan view illustrating a semiconductor substrate including inspection regions according to another example embodiment of the present invention.
Figure 7:
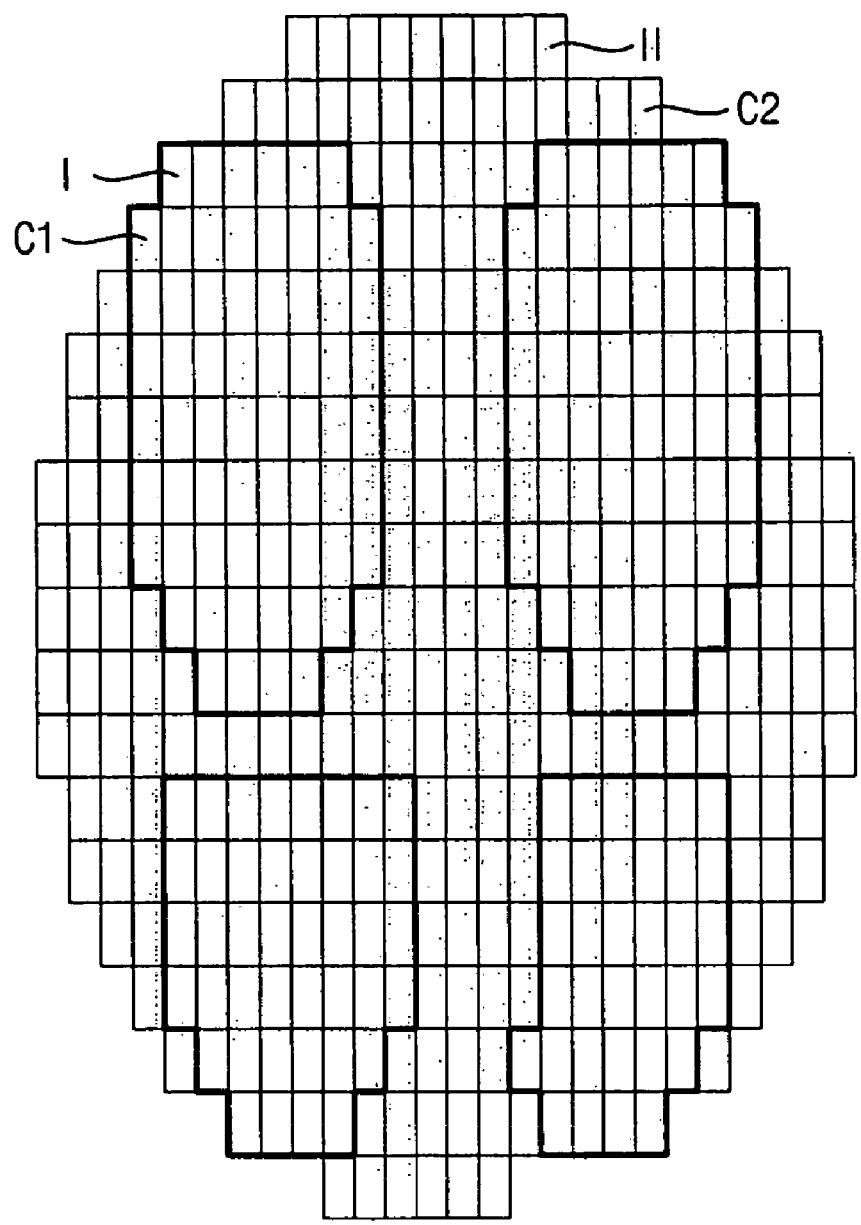
FIG. 7 is a plan view illustrating another semiconductor substrate including inspection regions according to another example embodiment of the present invention.

FIG. 5 is a flow chart illustrating a process of inspecting electrical characteristics of chips on a semiconductor substrate according to another example embodiment of the present invention. In an example, the process of FIG. 5 may be performed with the apparatus 200 of FIG. 4. FIG. 6 is a plan view illustrating a semiconductor substrate including inspection regions according to another example embodiment of the present invention. In an example, the semiconductor substrate of FIG. 6 may be an 8-inch semiconductor substrate. FIG. 7 is a plan view illustrating another semiconductor substrate including inspection regions according to another example embodiment of the present invention. In an example, the semiconductor substrate of FIG. 7 may be a 12-inch semiconductor substrate.

The example process of FIG. 5 now may be described with respect to the example embodiments of FIGS. 6 and 7.

In the example embodiment of FIG. 5, the probe card 100 may descend to a given proximity to the semiconductor substrate W on the stage 250 such that the first and second needles 125 and 125 may contact the first and second chips C1 and C2, respectively (at S310).

In the example embodiment of FIG. 6, when the semiconductor substrate W has a first diameter (e.g., approximately 8-inches), the probe card 100 may have an area substantially the same as that of the semiconductor substrate with the first diameter. Thus, the electrical characteristics of the first and second chips C1 and C2 may be inspected by establishing contact (e.g., a single contact) on a single position between the probe card 100 and the 8-inch semiconductor substrate W. As a result, a first region I of the probe card 100 corresponding to positions of the first needles 125 may correspond to a portion (e.g., a central portion) of the semiconductor substrate W upon which normal first chips C1 may be arranged. A second region II of the probe card 100 corresponding to positions of the second needles 126 may correspond to another portion (e.g., an edge portion) of the semiconductor substrate W upon which abnormal second chips. C2 may be arranged.

In an alternative example, referring the example embodiment of FIG. 7, when the semiconductor substrate W has a second diameter (e.g., approximately 12-inches), the probe card 100 may have an area smaller than that of the semiconductor substrate. Thus, the electrical characteristics of the first and second chips C1 and C2 may be inspected by establishing contact on at least two positions between the probe card 100 and the semiconductor substrate W. As a result, the first regions I of the probe card 100 may include normal first chips C1. The second region II of the probe card 100 may include normal and abnormal second chips C2.

In another alternative example, referring to FIGS. 6 and 7, when the probe card 100 has an area substantially the same as that of the second-diameter (e.g., 12-inch) semiconductor substrate, the first region I of the probe card 100 corresponding to the positions of the first needles 125 may correspond to a given portion (e.g., a central portion) of the second-diameter (e.g., 12-inch) semiconductor substrate W upon which the normal first chips C1 may be arranged. The second region II of the probe card 100 corresponding to the positions of the second needles 126 may correspond to another portion (e.g., an edge portion) of the second-diameter (e.g., 12-inch) semiconductor substrate W upon which the abnormal second chips C2 may be arranged.

Returning to the example embodiment of FIG. 5, the inspection unit 210 may supply the first circuit 122 with the first inspection current (at S320). Because the first inspection current flows into the two parallel lines 127, the first inspection current may be substantially equally divided into the two "halved" first divided inspection currents. Each of the first divided inspection currents may be supplied to each of the first needles 125 (at S330). Thus, the halved first inspection currents may be concurrently (e.g., simultaneously) supplied to the two first chips C1.

In the example embodiment of FIG. 5, the normality of the second chip C2 may be examined (at S340). In an example, when the semiconductor substrate W corresponds to the first-diameter (e.g., 8-inch) semiconductor substrate W of the example embodiment of FIG. 6, the second chips C2 making contact with the second needles 126 may be arranged on the edge portion of the first-diameter semiconductor substrate W such that a given number (e.g., a majority) of the second chips C2 on the first-diameter semiconductor substrate W may be abnormal. In an alternative example, when the semiconductor substrate W corresponds to the second-diameter semiconductor substrate W of the example embodiment of FIG. 7, the second chips C2 making contact with the second needles 126 may be arranged on the central portion of the second-diameter semiconductor substrate W as well as the edge portion of the second-diameter semiconductor substrate W. Thus, the second chips C2 on the 12-inch semiconductor substrate W may be either abnormal or normal.

In the example embodiment of FIG. 5, the second chip C2 (e.g., corresponding to the normal chip formed on the central portion of the semiconductor substrate W) may supplied with an inspection current (at S350). Thus, the inspection unit 210 may supply the second inspection current to the first circuit 123. The second inspection current may be separately supplied to a single second needle 126 through a single serial line 128. The inspection unit 210 may inspect the electrical characteristics of the first and second chips C1 and C2 based on the first and second inspection currents (at S360).

In the example embodiment of FIG. 5, in an alternative example, when the second chip C2 corresponds to an abnormal chip (e.g., formed at an edge portion of the semiconductor substrate W), the electrical characteristics of the abnormal second chip C2 need not be inspected. Thus, the current cutting unit 240 may reduce (e.g., cut off) the supply of the second inspection current to the second circuit 123 (at S370). Therefore, the second inspection current may not flow into the abnormal second chip C2 through the second needle 126. As a result, because an excessive current caused by the second inspection current supplied to the abnormal second chip C2 may not be applied to the tip of the second needle 126, the tip of the second needle 126 may not be burnt out.

In the example embodiment of FIG. 5, after S370, the inspection unit 210 may inspect the electrical characteristics of the normal first chips C1 based on the first inspection current supplied to the normal first chips C1 (at S380). The inspection unit 210 may not inspect the electrical characteristics of the abnormal second chips C2.

In another example embodiment of the present invention, a first divided inspection current and a second inspection current may be supplied separately to different chips on a probed object. Alternatively, the first divided inspection current and the second inspection current may be concurrently (e.g., simultaneously) supplied.

In another example embodiment of the present invention, a plurality of first needles may contact normal chips on a probed object. The plurality of first needles may be electrically connected to a first circuit with a first ratio such that at least two normal chips may be concurrently (e.g., simultaneously) inspected using a lesser number of separate inspection currents (e.g., a single inspection current). A probe apparatus may thereby have an improved inspection efficiency. Further, a plurality of second needles may contact abnormal chips. The plurality of second needles may be electrically connected to a second circuit with a second ratio (e.g., 1:1) such that the supply of the second inspection current to the second needles may be selectively reduced (e.g., cut off). Thus, the plurality of second needles contacting the abnormal chips may not be burnt out.

Example embodiments of the present invention being thus described, it will be obvious that the same may be varied in many ways. For example, while specific dimensions are described in the above example embodiments (e.g., 12-inch semiconductor substrate, 8-inch semiconductor substrate, etc.), it is understood that such numbers are given for example purposes only and are not intended to limit the scope of the present invention. Also, the particular ratios described above with respect to needles and chips are also meant as examples only, as any alternative ratio may be employed without falling outside of the scope of the present invention.

Such variations are not to be regarded as a departure from the spirit and scope of example embodiments of the present invention, and all such modifications as would be obvious to one skilled in the art are intended to be included within the scope of the following claims.

What is claimed is:

1. A method of inspecting an object, comprising:
dividing a first inspection current into a plurality of first divided inspection currents;
supplying the first divided inspection currents from a plurality of first test circuits to a plurality of first chips, each of the plurality of first test circuits supplying first divided inspection currents, from among the plurality of first divided inspection currents, to at least two chips from among the plurality of first chips;

determining whether a plurality of second chips is normal or not;

selectively supplying a plurality of second inspection currents from a plurality of second test circuits to the plurality of second chips based on whether the second chips are determined to be normal, the second inspection currents being selectively cut off from the second test circuits to each one of the plurality of second chips that are determined to be abnormal, each of the plurality of second test circuits supplying second inspection currents, from among the plurality of second inspection currents, to only one chip from among the plurality of second chips.

2. The method of claim 1, wherein the supplying of the first divided inspection currents and the selective supplying of the second inspection current is performed concurrently.

3. The method of claim 1, wherein the first inspection current is equal to a number of the first divided inspection currents multiplied by the second inspection current.

4. The method of claim 3, wherein the first inspection current is about two times the amount of the second inspection current.

5. The method of claim 1, wherein the object includes a semiconductor substrate upon which the plurality of second chips and the plurality of first chips are formed.

6. The method of claim 5, wherein the plurality of first chips is formed on a first portion of the semiconductor substrate, and the plurality of second chips is formed on a second portion of the semiconductor substrate.

7. The method of claim 6, wherein the first portion is a center portion and the second portion is an edge portion.

8. A probe card performing the method of claim 1.

9. An apparatus including a probe card performing the method of claim 1.

* * * * *